(12) United States Patent
Walker et al.

(10) Patent No.: US 8,129,788 B1
(45) Date of Patent: Mar. 6, 2012

(54) CAPACITOR TRIGGERED SILICON CONTROLLED RECTIFIER

(75) Inventors: Andrew Walker, Mountain View, CA (US); Helmut Puchner, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 128 days.

(21) Appl. No.: 11/656,072

(22) Filed: Jan. 22, 2007

Related U.S. Application Data

(60) Provisional application No. 60/761,528, filed on Jan. 24, 2006.

(51) Int. Cl.
*H01L 23/62* (2006.01)

(52) U.S. Cl. ............... 257/355; 257/E29.181; 438/133

(58) Field of Classification Search ............... 257/355, 257/E29.181; 438/133
See application file for complete search history.

(56) References Cited

U.S. PATENT DOCUMENTS

| | | | |
|---|---|---|---|
| 4,990,802 A | 2/1991 | Smooha | |
| 5,019,888 A | 5/1991 | Scott et al. | |
| 5,043,782 A | 8/1991 | Avery | |
| 5,140,401 A | 8/1992 | Ker et al. | |
| 5,157,573 A | 10/1992 | Lee et al. | |
| 5,159,518 A * | 10/1992 | Roy | 361/56 |
| 5,173,755 A | 12/1992 | Co | |
| 5,182,220 A | 1/1993 | Ker et al. | |
| 5,218,222 A | 6/1993 | Roberts | |
| 5,237,395 A | 8/1993 | Lee | |
| 5,264,723 A | 11/1993 | Strauss | |
| 5,289,334 A | 2/1994 | Ker et al. | |
| 5,311,391 A | 5/1994 | Dungan | |
| 5,329,143 A | 7/1994 | Chan et al. | |
| 5,444,400 A | 8/1995 | Hall | |
| 5,508,649 A | 4/1996 | Shay | |
| 5,576,557 A | 11/1996 | Ker et al. | |
| 5,591,992 A | 1/1997 | Leach | |
| 5,602,404 A | 2/1997 | Chen et al. | |
| 5,625,522 A | 4/1997 | Watt | |
| 5,640,299 A | 6/1997 | Leach | |
| 5,670,799 A | 9/1997 | Croft | |
| 5,671,111 A | 9/1997 | Chen | |
| 5,675,469 A | 10/1997 | Racino et al. | |
| 5,682,047 A | 10/1997 | Consiglio et al. | |
| 5,751,507 A | 5/1998 | Watt et al. | |

(Continued)

OTHER PUBLICATIONS

USPTO Notice of Allowance for U.S. Appl. No. 08/515,433 dated Oct. 23, 1997; 1 page.

(Continued)

*Primary Examiner* — Thao Le
*Assistant Examiner* — Matthew Gordon

(57) ABSTRACT

A protection circuit and method are provided for protecting semiconductor devices from electrostatic discharge (ESD). Generally, the ESD protection circuit includes a silicon controlled rectifier (SCR) formed in a substrate and configured to transfer charge from a protected node to a negative power supply, $V_{SS}$, during an ESD event, and a trigger device to activate transfer of charge by the SCR when a voltage on the protected node reaches a predetermined trigger voltage. The trigger device includes a gated-diode and MOS capacitor formed in a well formed in the substrate, the trigger device configured to inject electrons into the well during charging of the MOS capacitor, forward biasing a node of the SCR, hence allowing fast triggering of the SCR device. The trigger voltage can be set independent of a holding voltage by adjusting the length of the well and area of the capacitor. Other embodiments are also disclosed.

5 Claims, 4 Drawing Sheets

U.S. PATENT DOCUMENTS

| | | | |
|---|---|---|---|
| 5,825,600 | A | 10/1998 | Watt |
| 6,011,420 | A | 1/2000 | Watt et al. |
| 6,091,114 | A * | 7/2000 | Mogul et al. .................. 257/360 |
| 6,140,189 | A * | 10/2000 | Hsu et al. ...................... 438/294 |
| 6,358,781 | B1 | 3/2002 | Lee et al. |
| 6,765,771 | B2 * | 7/2004 | Ker et al. ......................... 361/56 |

OTHER PUBLICATIONS

USPTO Non-Final Rejection for U.S. Appl. No. 08/515,433 dated Jul. 8, 1997; 4 pages.

USPTO Requirement for Restriction/Election for U.S. Appl. No. 08/515,433 dated Dec. 12, 1996; 3 pages.

USPTO Notice of Allowance for U.S. Appl. No. 09/017,125 dated Jul. 6, 1999; 4 pages.

USPTO Non-Final Rejection for U.S. Appl. No. 09/017,125 dated Mar. 8, 1999; 8 pages.

USPTO Notice of Allowance for U.S. Appl. No. 08/845,302 dated May 19, 1998; 1 page.

USPTO Non-Final Rejection for U.S. Appl. No. 08/845,302 dated Feb. 6, 1998; 6 pages.

Duvvury et al., "ESD Phenomena and Protection Issues in CMOS Output Buffers," 1987; pp. 174-180; 4 pages.

Duvvury et al., "Internal Chip ESD Phenomena Beyond the Protection Circuit," 1988; pp. 2133-2138; 6 pages.

Polgreen et al., "Improving the ESD Failure Threshold of Silicided nMOS Output Transistors by Ensuring Uniform Current Flow," 1989; pp. 167-174; 8 pages.

Duvvury et al., "Achieving Uniform nMOS Device Power Distribution for Sub-micron ESD Reliability," 1992; 92-131 through 92-134; 4 pages.

Steven H. Voldman, "ESD Protection in a Mixed Voltage Interface and Multi-Rail Disconnected Power Grid Environment in 0.50- and 0.25-um Channel Length CMOS Technologies," 1995; 94-125 through 94-134; 10 pages.

Dabral et al., "Core Claps for Low Voltage Technologies," 1994; 94-141 through 94-149; 9 pages.

Voldman et al., "Mixed-Voltage Interface ESD Protection Circuits for Advance Microprocessors in Shallow Trench and LOCOS Isolation CMOS Technologies," 1994; 94-277 through 94-280; 4 pages.

Jaffe et al., "Electrostatic Discharge Protection in a 4-MBIT Dram," 1990; pp. 1-6; 6 pages.

LeBlanc et al., "Proximity Effects of 'Unused' Output Buffers on ESD Performance," 1991; pp. 327-330; 4 pages.

Worley et al., "Sub-Micron Chip ESD Protection Schemes which Avoid Avalanching Junction," 1995; 95-13 through 95-20; 8 pages.

Chatterjee et al., "A Low-Voltage Triggering SCR for On-Chip ESD Protection at Output and Input Pads," 1991; pp. 21-22; 2 pages.

USPTO Notice of Allowance for U.S. Appl. No. 08/297,629 dated Oct. 28, 1996; 8 pages.

USPTO Final Rejection for U.S. Appl. No. 08/297,629 dated Jun. 10, 1996; 6 pages.

USPTO Non-Final Rejection for U.S. Appl. No. 08/297,629 dated Sep. 12, 1995; 8 pages.

USPTO Notice of Allowance for U.S. Appl. No. 08/758,336 dated Dec. 4, 1997; 2 pages.

USPTO Non-Final Rejection for U.S. Appl. No. 08/758,336 dated Aug. 13, 1997; 6 pages.

Tandan, "ESD Trigger Circuit," EOS/ESD Symposium 1994, pp. 94-120 through 94-124; 5 pages.

Merrill et al., "ESD Design Methodology," EOS/ESD Symposium 1993, pp. 93-233 through 93-237; 5 pages.

van Roozendaal et al., "Standard ESD Testing of Integrated Circuits," 1990 EOS/ESD Symposium Proceedings, pp. 119-130; 12 pages.

Watt et al., "A Hot-Carrier Trigger SCR for Smart Power Bus ESD Protection," Cypress Semiconductor Corporation, 1995 IEEE Electron Device Letters, vol. 12, No. 1, Jan. 1991; 4 pages.

* cited by examiner

US 8,129,788 B1

CAPACITOR TRIGGERED SILICON CONTROLLED RECTIFIER

CROSS-REFERENCE TO RELATED APPLICATIONS

The present application claims the benefit of priority under 35 U.S.C. 119(e) to U.S. Provisional Patent Application Ser. No. 60/761,528 filed Jan. 24, 2006, entitled A Fast Capacitor Triggered SCR ESD Clamp for CMOS; which application is hereby incorporated by reference.

TECHNICAL FIELD

This invention relates to semiconductor devices and, more particularly, to protection devices for protecting integrated circuits from various electrical transients, including electrostatic discharge.

BACKGROUND OF THE INVENTION

As integrated circuit (IC) geometries continue to shrink, susceptibility to electrostatic discharge (ESD) damage increases. In particular, decreasing gate oxide thicknesses in MOS (metal-oxide-semiconductor) devices relative to breakdown voltage has resulted in an increased susceptibility to damage from the application of excessive voltages. During an ESD event, charge is transferred between one or more pins of the integrated circuit and another conducting object. This charge transfer can develop voltages that are large enough to break down insulating gate oxides, leading to failures, such as contact spiking, silicon melting, or metal interconnect melting.

Many attempts have been made in the prior art to protect semiconductor devices from such ESD events. One common approach uses protection circuits connected to I/O (input-output) pads of an IC to safely dissipate the energy associated with ESD events without causing any damage to the internal circuitry.

An exemplary embodiment of an ESD protection circuit is shown in the FIG. 1. Referring to FIG. 1, the ESD protection circuit 100 includes a protected ESD bus or node 102 that is connected to one or more input pads 104 through a number of diodes $D_1$, $D_2$. The ESD protection circuit 100 is configured to couple the protected $V_{ESD}$ node 102 to a negative power supply, $V_{SS}$, through a FET (field effect transistor) triggered SCR (silicon controlled rectifier) circuit 106. In circuit shown in FIG. 1, the SCR 106 includes a NPN bipolar transistor Q1 and a PNP bipolar transistor Q2 interconnected so that each transistor receives base current from the collector terminal of the other, and a FET 108 configured to trigger the SCR into conduction, thereby providing a low-impedance path to safely shunt an ESD charge to $V_{SS}$. The ESD protection circuit 100 further includes a number of resistors $R_1$, $R_2$ and $R_3$, to insure proper operation of the SCR 106 and FET 108, to provide predetermined impedance when the circuit is conducting and/or to limit current through the FET during an ESD event. In a normal operating state the ESD protection circuit 100 is in a high-impedance "OFF" state, thereby reducing externally-sourced leakage currents into pads 104. In an "ON" state the ESD protection circuit 100 is configured to transfer charge from the $V_{ESD}$ bus to $V_{SS}$ when a voltage on the $V_{ESD}$ node 102 reaches a predetermined threshold or trigger voltage.

A cross-sectional view of the ESD protection circuit of FIG. 1 is shown in FIG. 2. Generally, the circuit is fabricated on a P-type silicon substrate 200, and includes a first P+ ohmic contact 202, a N+ drain region 204, a N+ source region 206, a channel region 208 between the spaced apart drain and source regions, a N-well region 210, a second N+ ohmic contact 212, a third N+ ohmic contact 214, and a P+ junction region 216 formed in the N-well. A layer of dielectric material overlies a portion of substrate, including a gate dielectric region overlying the channel region. A conductive silicide layer 218 is formed over several of the diffusion regions, and a transistor control gate 220 is formed over the dielectric overlying the channel region. Structures labeled FOX are field oxide regions.

Several trigger mechanisms have been used in the past to turn on SCR protection devices for ESD. These trigger mechanisms include avalanche breakdown of a drain diode of a MOS transistor, MOS transistor source-drain current and collector current from bipolar transistor. For example, in the circuit described above when the voltage on ESD bus reaches the NMOS drain breakdown voltage, current begins to flow in the N-well 210 between N+ regions 212 and 214 as the drain junction 204 breaks down, and injects holes into the substrate. The hole injection into substrate forward biases the N+ source 206 injecting electrons, which are collected by both the N+ drain 204, and the adjacent N-well. Simultaneous with the drain breakdown, the current flowing between the N+ regions 212 and 214 results in a voltage drop across the N-well, which causes the P+ region 216 to become forward biased resulting in an injection of holes into substrate, thereby hastening the transition of the SCR into a latched state.

The above described protection circuit works well with current generation of devices having circuit geometries much greater than 65 nm (nanometers). However, it will be appreciated that although the well current immediately starts flowing as soon as the FET drain junction starts avalanching, the SCR does not trigger until the FET reaches drain breakdown voltage. Thus, the turn on characteristic of the protection circuit is too slow for devices using technologies less than 65 nm, and in particular for fast ESD events, such as those described by the Charged Device Model (CDM) failures.

In addition, conventional protection circuits such as in FIG. 1 have a trigger voltage that can be high enough to cause damage in thin gate dielectrics that need to be protected.

Accordingly, there is a need for a fast triggering ESD protection circuitry for protection in technologies less than 65 nm, and in particular for fast ESD events, such as those described by the CDM. There is also a need for an ESD protection circuitry in which trigger current and voltage can be set independently using many circuit and/or layout parameters, and where the trigger voltage is low enough.

The present invention provides a solution to these and other problems, and offers further advantages over conventional ESD protection approaches.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed generally to a fast triggered SCR (silicon controlled rectifier) that can trigger at a low enough voltage to protect thin oxides in integrated circuits from various electrical transients, including electrostatic discharge (ESD).

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

Figure 1:
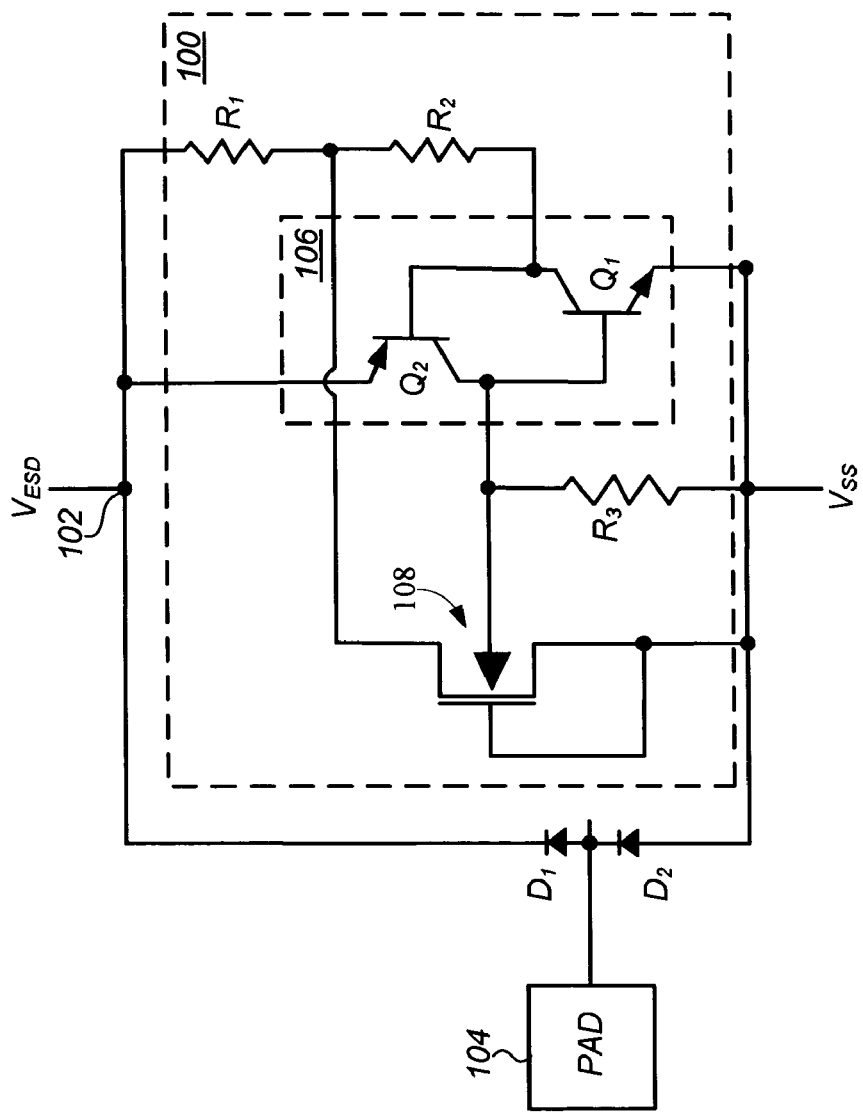
FIG. 1 (Prior Art) is a simplified schematic diagram view of an electrostatic discharge (ESD) protection circuit for protecting a semiconductor device from ESD events.
Figure 2:
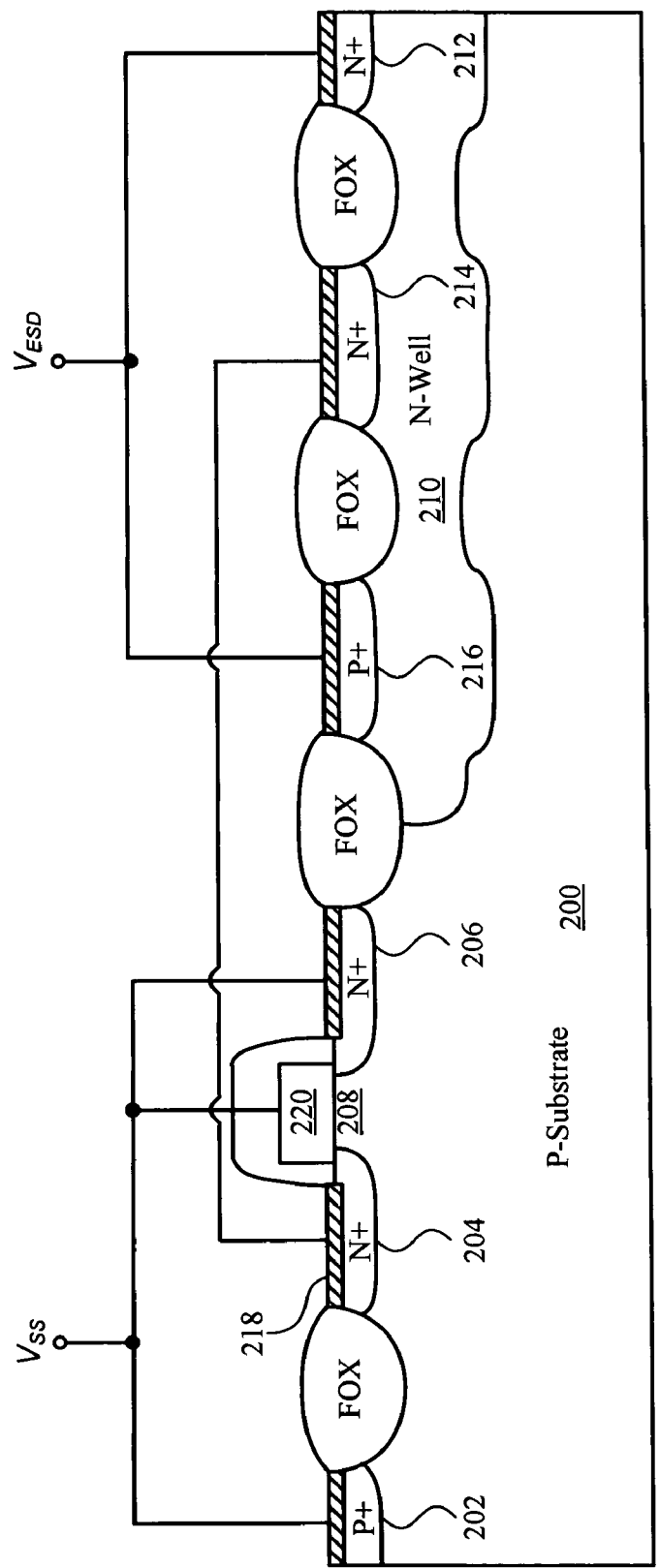
FIG. 2 (Prior Art) is a simplified cross-sectional view of a semiconductor structure implementing the ESD protection circuit of FIG. 1.
Figure 3:
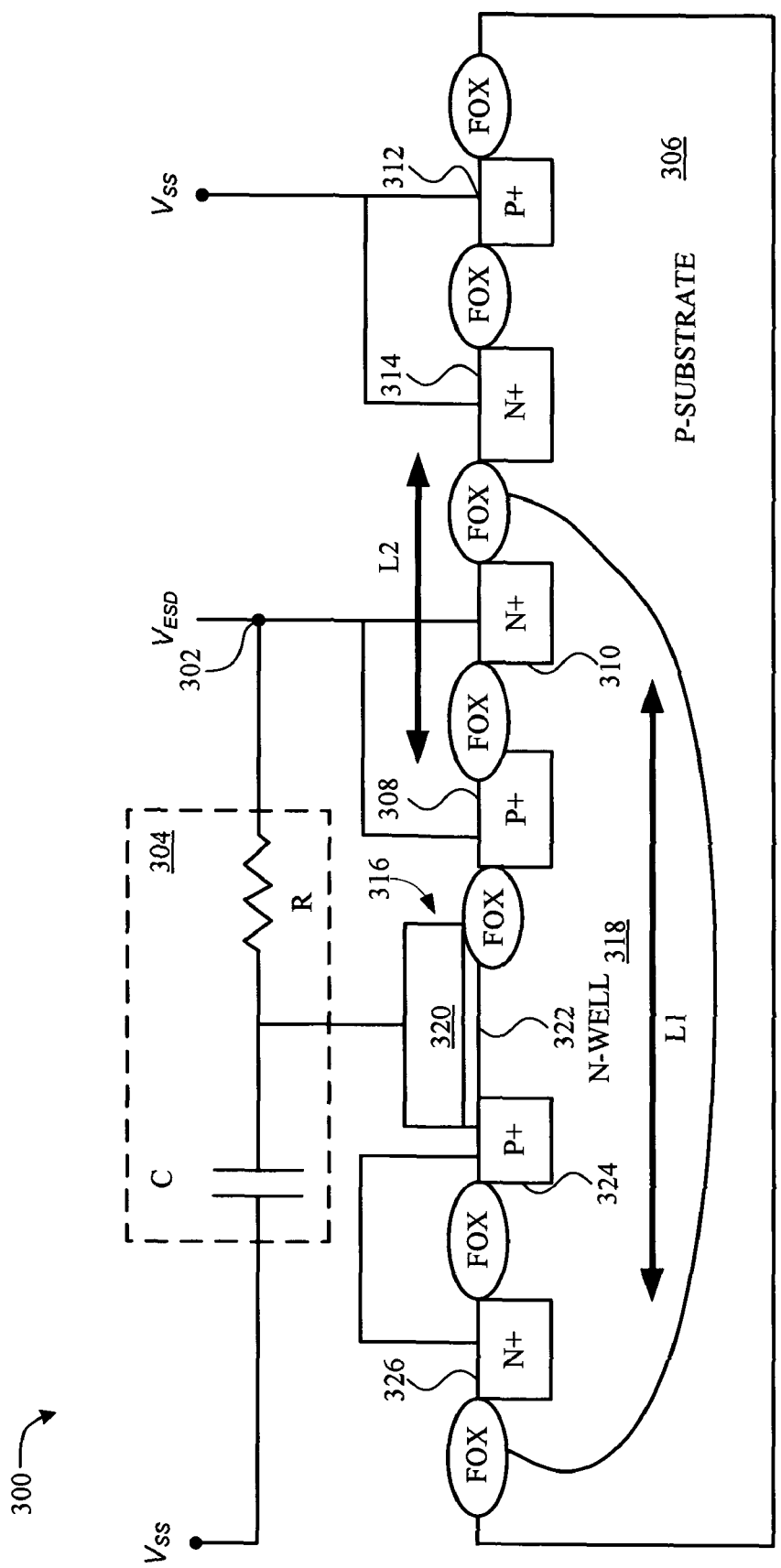
FIG. 3 is a cross-sectional view of a fast, capacitor triggered silicon controlled rectifier (SCR) ESD protection circuit according to an embodiment of the present invention.

The ESD clamp or protection circuit of the present invention will now be described in detail with reference to FIG. 3. Referring to FIG. 3, the ESD protection circuit 300 includes a protected ESD bus or node 302 that is connected to one or more I/O (input-output) pads (not shown) of a semiconductor device or integrated circuit (IC), and to a negative power supply, $V_{SS}$, through an RC network 304. As noted above the ESD protection circuit 300 generally includes a SCR formed in a substrate 306 and configured to transfer charge from the protected node 302 to $V_{SS}$ to safely dissipate the energy associated with ESD events without causing any damage to the internal circuitry of the device or IC. In the embodiment shown, the SCR is a PNPN type SCR device formed in a P-substrate 306 from a number of diffusion regions separated by a number of field oxide (FOX) regions or structures. The diffusion regions include a P+ diffusion region 308 and an N+ tap 310 connected to the protected node 302, and a P+ tap region 312 and an N+ diffusion 314 connected to $V_{SS}$.

In accordance with the present invention, the ESD protection circuit 300 further includes a trigger device comprising a gated-diode and MOS capacitor or a gated-diode/MOS capacitor 316 formed within a well region or well 318 in the substrate 306. In the embodiment shown, the gated-diode/MOS capacitor 316 is formed in an N-well of a P-type substrate 306, and comprises gate electrode or gate 320 separated from a channel region in the N-well by a thin gate oxide 322, and a number of diffusion regions including a first P+ diffusion region 324 and an N+ tap region 326. These first and second regions 324, 326, are shorted together to allow inversion current to flow and cause a current to flow in the Nwell 318.

In the embodiment shown, the well 318 is a well of N-type material or doping formed within a P-type substrate 306, however it will be appreciated by those skilled in the art that the materials of the well and substrate can be interchanged, along with interchanging of the diffusion regions of the SCR and the gated-diode/MOS capacitor 316 without departing from the spirit and scope of the invention. In addition, it is noted that the doping of the first diffusion region 308 and tap 310 of the SCR may be interchanged, with or without change to the substrate 306 or well 318 doping, to form a NPNP type SCR. Generally, the values for R and C in the RC network 304 are chosen such that during an ESD event the well 318 rises in potential faster than the gate 320 of the gated-diode MOS capacitor's 316 to which the protected node 302 is coupled. Thus, during an ESD event, such as the sudden application or zapping of the protected node 302 by a positive voltage with respect to Vss, the rapidly rising voltage causes an inversion current to flow from P+ diffusion region 324 of the gated-diode 316 charging the MOS capacitor. The charging current passing through the well 318 forward biases the first P+ diffusion region 308 rapidly triggering the SCR.

It will be understood from the above that the trigger mechanism is dependent on the charging current of the MOS capacitor 316 in combination with the well 318 resistance forward biasing the diffusion region 308. The well current is proportional to the MOS capacitor area, that is the area, A, under the gated-diode 316, and to the voltage rise rate (V/s) of the zap, and inversely proportional to the gate dielectric 322 thickness. Moreover, the isolation space or length between the SCR and the gated-diode 316, indicated by arrow L1 in FIG. 3, determines the well resistance, and hence partly determines the trigger voltage. Thus, the trigger current and voltage can be set by adjusting length of L1, and/or the capacitor area A. Normal ranges for capacitor area are from 50 to 500 um2 yielding a capacitance of from about 600 to about 6000 femtofarads (fF) (with gate oxide thickness of 32 A), and a length L1 of from about 5 um to about 50 um.

Referring again to FIG. 3, the holding voltage, that is the voltage to which the protected node 302 is held during an ESD event, is determined by the resistance of the path through the portion of the well 318 and the substrate 306 separating the protected node from $V_{SS}$. Thus, it will be appreciated that the holding voltage can be set by adjusting the distance or length, indicated by arrow L2, separating the first P+ diffusion region 308 of the SCR, which is connected to the protected node 302, and second N+ diffusion 314 of the SCR, which is connected to $V_{SS}$.

The ESD protection circuit 300 of the present invention is particularly suitable for use as power supply protection, since the SCR is stable, that is not-conducting, since the gated-diode does not charge within a threshold voltage (VT) noise level of the power 15 supply. Methods for transferring charge from a protected node to Vss during an ESD event according to an embodiment of the present invention will now be described with reference to the flowchart of FIG. 4.

Figure 4:
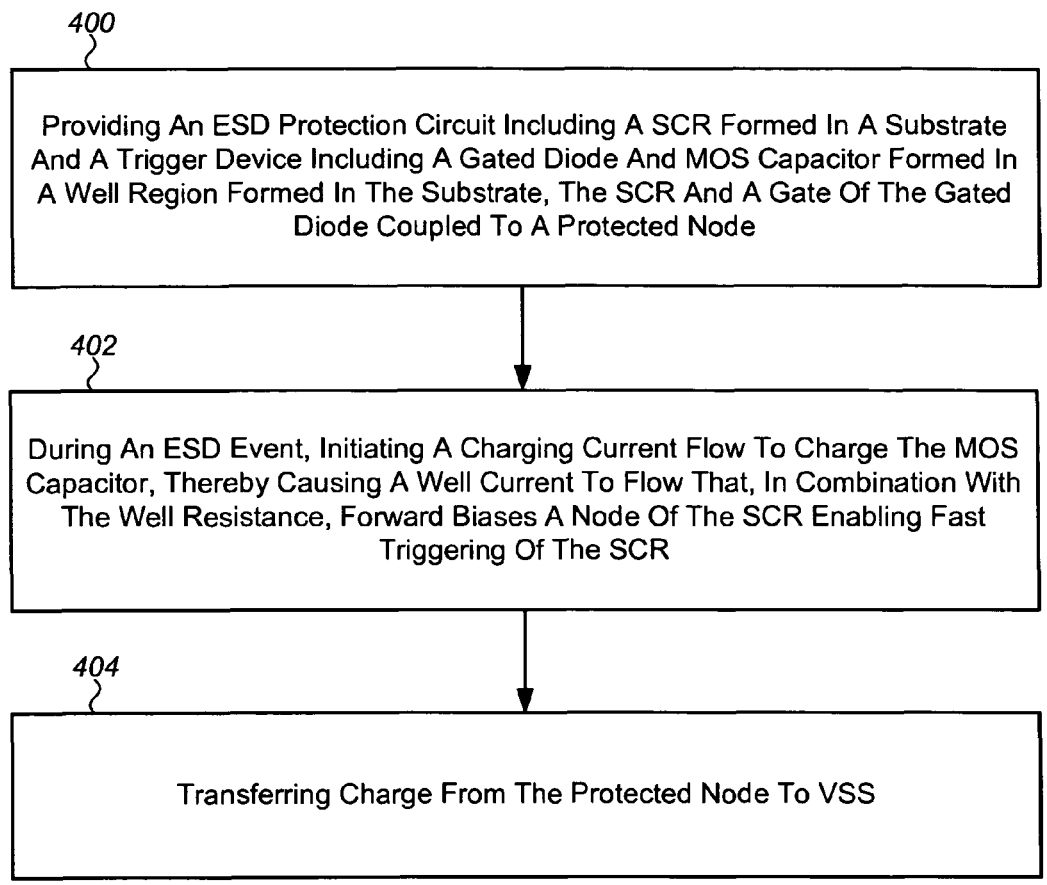
FIG. 4 is a flow chart of a method of operating an ESD protection circuit according to an embodiment of the present invention.

Referring to FIG. 4, the method begins with providing an ESD protection circuit including a SCR formed in a substrate and a trigger device including a gated-diode and MOS capacitor formed in a well region formed in the substrate, the SCR and a gate of the gated-diode coupled to a protected node (Step 400). During an ESD event, the sudden application of a positive charge with respect to $V_{SS}$ on the protected node, initiates a charging current flow to charge the MOS capacitor, thereby causing a well current to flow that, in combination with the well resistance, forward biases a node of the SCR enabling fast triggering of the SCR (Step 402). The SCR provides a low-impedance path to safely shunt or transfer the ESD charge from the protected node to $V_{SS}$ (Step 404).

The advantages of the ESD protection circuit of the present invention over previous or conventional methods include: (i) a trigger time fast enough for CDM protection in submicron 45 nm and 65 nm CMOS transistors; (ii) trigger voltage low enough to protect very thin gate oxides; (iii) trigger current and voltage can be set using many layout parameters; (iv) high stability for power supply protection; (v) fabrication of the protection circuitry does not conflict with existing processing steps nor require extra manufacturing steps; and (vi) provides sufficient ESD protection without the degradation in performance of the protected circuit.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A trigger circuit comprising:
   a gated-diode/metal-oxide-semiconductor (MOS) capacitor trigger device formed in an N-type well region of a P-type substrate and connected to a PNPN silicon controlled rectifier SCR formed partly in the well region and partly in the substrate, wherein a first portion of a gate of the gated-diode/MOS capacitor is separated from the well region by a gate dielectric and a second portion of the gate of the gated-diode/MOS capacitor is separated from the well region by a field oxide region and not by the gate dielectric, the field oxide region also separating the gate of the gated diode/MOS capacitor from a first P+ type region of the SCR in the N-type well region, wherein the SCR includes the first P+ diffusion region and a first N+ tap in the N-type well both connected to a protected ESD node, and a second P+ diffusion region and a second N+ tap both in the P-type substrate and connected to a negative power supply, Vss;
   a resistor-capacitor R/C network including a capacitor, C, through which a gate node of the gated-diode/MOS capacitor is coupled to the negative power supply, Vss, and a resistance element, R.1 through which the gate node is coupled to the protected ESD node;
   wherein the gated-diode/MOS capacitor is configured to inject electrons into the N-type well region when a voltage on the protected ESD node reaches a predetermined trigger voltage causing a well current to flow, charging the MOS capacitor to trigger the SCR to transfer charge from the protected node to Vss; and
   wherein an area A of the gated-diode/MOS capacitor, and a distance, L1, isolating the SCR device from the gated-diode/MOS capacitor in the substrate are selected to define the predetermined trigger voltage.

2. A trigger circuit according to claim 1, wherein the area, A, of the MOS capacitor and a voltage rise rate (V/s) during a positive ESD event on the protected node, and a gate dielectric thickness of the gated-diode/MOS capacitor together define the well current.

3. A trigger circuit according to claim 1, wherein the voltage to which the protected ESD node is held during an ESD event is set by a distance, L2, between the first P+ diffusion region and the second N+ tap connected to Vss.

4. A trigger circuit according to claim 1, wherein the first P+ diffusion region and the first N+ tap are formed within the Nwell region.

5. A trigger circuit according to claim 1, wherein R and C are chosen such that during a positive ESD event on the protected node, potential in the well rises faster than on the gate of the gated-diode/MOS capacitor.

* * * * *